(12) United States Patent
Markytan et al.

(10) Patent No.: US 10,047,915 B2
(45) Date of Patent: Aug. 14, 2018

(54) OPTICAL ELEMENT AND LIGHTING DEVICE COMPRISING AN OPTICAL ELEMENT

(71) Applicant: OSRAM GmbH, Munich (DE)

(72) Inventors: Ales Markytan, Regensburg (DE); Christian Gärtner, Regensburg (DE); Horst Varga, Lappersdorf (DE); Jan Marfeld, Regensburg (DE); Janick Ihringer, Regensburg (DE); Manfred Scheubeck, Pulau Pinang (MY); Roland Schulz, Regensburg (DE); Alexander Linkov, Regensburg (DE)

(73) Assignee: OSRAM GmbH, München (DE)

( * ) Notice: Subject to any disclaimer, the term of this patent is extended or adjusted under 35 U.S.C. 154(b) by 633 days.

(21) Appl. No.: 14/430,979

(22) PCT Filed: Sep. 26, 2013

(86) PCT No.: PCT/EP2013/070028
§ 371 (c)(1),
(2) Date: Mar. 25, 2015

(87) PCT Pub. No.: WO2014/049031
PCT Pub. Date: Apr. 3, 2014

(65) Prior Publication Data
US 2015/0252961 A1    Sep. 10, 2015

(30) Foreign Application Priority Data
Sep. 26, 2012   (DE) .................. 10 2012 109 113

(51) Int. Cl.
*F21V 5/08* (2006.01)
*F21V 7/09* (2006.01)
(Continued)

(52) U.S. Cl.
CPC ............. *F21K 9/50* (2013.01); *F21K 9/60* (2016.08); *F21V 5/08* (2013.01); *F21V 7/0066* (2013.01);
(Continued)

(58) Field of Classification Search
CPC ..... F21K 9/50; F21K 9/60; F21K 9/66; F21V 7/0066; F21V 7/0091; F21V 5/08
See application file for complete search history.

(56) References Cited

U.S. PATENT DOCUMENTS 8,556,452 B2 * 10/2013 Simon .............. B29D 11/00278
362/217.07
8,757,845 B2 * 6/2014 Tseng ..................... H01L 33/58
362/257
(Continued)

FOREIGN PATENT DOCUMENTS

DE   102004046173 A1   5/2005
EP        2375130 A1 * 10/2011 ................ F21V 5/08
(Continued)

*Primary Examiner* — Alan Cariaso
(74) *Attorney, Agent, or Firm* — Slater Matsil, LLP (57) ABSTRACT

An optical element is provided for beam shaping for radiation emitted by a radiation-emitting semiconductor chip. The optical element includes a radiation entrance face and a boundary surface different from the radiation entrance face with a first region and a second region. The first and second regions are arranged and embodied such that a first radiation portion of radiation entering the optical element through the radiation entrance face is reflected in the first region and after reflection in the first region is deflected in the second region towards a plane defined by the radiation entrance face.

17 Claims, 7 Drawing Sheets

(51) Int. Cl.
  *F21K 99/00* (2016.01)
  *F21V 7/00* (2006.01)
  *H01L 33/58* (2010.01)
  *F21K 9/60* (2016.01)
  *F21Y 115/10* (2016.01)

(52) U.S. Cl.
  CPC ............ *F21V 7/0091* (2013.01); *H01L 33/58* (2013.01); *F21Y 2115/10* (2016.08); *H01L 2924/0002* (2013.01)

(56) References Cited

U.S. PATENT DOCUMENTS

| | | |
|---|---|---|
| 2005/0068786 A1 | 3/2005 | Ishida |
| 2006/0067079 A1 | 3/2006 | Noh et al. |
| 2006/0152820 A1 | 7/2006 | Lien et al. |
| 2006/0208267 A1 | 9/2006 | Chin et al. |
| 2006/0291205 A1 | 12/2006 | Jeon |
| 2010/0201911 A1 | 8/2010 | Illyama et al. |
| 2012/0014112 A1 | 1/2012 | Li |
| 2012/0044700 A1* | 2/2012 | Chen .................. F21V 3/00 362/311.02 |
| 2012/0081907 A1 | 4/2012 | Kato et al. |
| 2012/0155092 A1 | 6/2012 | Hsueh et al. |
| 2013/0051031 A1* | 2/2013 | Sun .................. F21V 5/00 362/311.06 |

FOREIGN PATENT DOCUMENTS

| | | |
|---|---|---|
| WO | 2008007492 A1 | 1/2008 |
| WO | 2012005008 A1 | 1/2012 |

\* cited by examiner

OPTICAL ELEMENT AND LIGHTING DEVICE COMPRISING AN OPTICAL ELEMENT

This patent application is a national phase filing under section 371 of PCT/EP2013/070028, filed Sep. 26, 2013, which claims the priority of German patent application 10 2012 109 113.7, filed Sep. 26, 2012, each of which is incorporated herein by reference in its entirety.

TECHNICAL FIELD

The present invention relates to an optical element and a lighting device comprising an optical element which is provided for beam shaping for radiation emitted by a radiation-emitting semiconductor chip.

SUMMARY

An optical element is provided which simplifies the provision of a lighting device which emits a significantly large radiation portion at large angles.

A proposed optical element is provided for beam shaping for radiation emitted by a radiation-emitting semiconductor chip. The optical element comprises a radiation entrance face and a boundary surface different from the radiation entrance face with a first region and a second region. The first and second regions are arranged and embodied such that a first radiation portion of radiation entering the optical element through the radiation entrance face is reflected in the first region and after reflection in the first region is deflected in the second region towards a plane defined by the radiation entrance face. In other words, after reflection in the first region the first radiation portion may be deflected in the second region in such a way that it crosses or passes through the plane defined by the radiation entrance face. The first radiation portion is preferably refracted by the second region.

A further aspect of the present application relates to a lighting device comprising the above-described optical element. The lighting device further comprises a radiation-emitting semiconductor chip. The radiation-emitting semiconductor chip comprises an emission face, which may determine a surface normal. The emission face of the radiation-emitting semiconductor chip is preferably planar, like the radiation entrance face of the optical element. Furthermore, the radiation entrance face is preferably arranged parallel to the emission face of the radiation-emitting semiconductor chip. The emission face preferably constitutes a main emission face of the radiation-emitting semiconductor chip. The semiconductor chip preferably takes the form of a surface emitter. In contrast to volume emitters, which emit a significant radiation portion via side faces, surface emitters emit mainly via a single surface.

In a preferred configuration, the optical element has a recess in which the radiation-emitting semiconductor chip may be arranged. As a result of this configuration, a form-fitting connection may advantageously be achieved between the optical element and the radiation-emitting semiconductor chip, whereby the stated components may, for example, be mutually stabilized or fixed.

In a preferred configuration, the emission face is arranged along, for example, parallel to, the radiation entrance face. Radiation which is emitted via the emission face of the radiation-emitting semiconductor chip may enter directly into the optical element. The surface normal of the emission face of the radiation-emitting semiconductor chip may be antiparallel to a surface normal of the radiation entrance face of the optical element. In the present application references to the surface normal of the emission face preferably also apply to a vector antiparallel to the surface normal of the radiation entrance face of the optical element or to a direction antiparallel thereto.

The lighting device may additionally comprise a carrier, on which the radiation-emitting semiconductor chip is arranged. The optical element may also be arranged on the carrier.

The radiation entrance face of the optical element is preferably of planar embodiment. The radiation entrance face of the optical element may define a plane in which the radiation entrance face lies.

One advantage of the described optical element is that, the first radiation portion after deflection in the second region or the radiation emitted by the optical element or by the lighting device has an opposite direction component to the radiation entrance direction into the optical element. In other words, at least one direction component of the first or emitted radiation portion may point backwards. Radiation may thereby be emitted advantageously backwards by the optical element, i.e., at an angle of more than 90° relative to the surface normal of the emission face or to the radiation entrance direction. It is then advantageously possible to dispense with a secondary optical system, which might likewise bring about backward emission. It is moreover advantageously possible to dispense with diffusive elements, which may emit radiation in a rearward or backward direction passively by way of luminescence conversion, but generally cause high radiant power or luminous flux losses.

Where reflection, transmission or deflection, for example, refraction, of radiation is described herein, it may be meant that in each case a major part, for example, more than 50%, more than 60%, more than 70%, more than 80% or more than 90% of the radiation or the radiant power impinging on the respective region is reflected, transmitted or deflected. It should in this respect be taken into account that reflection or transmission losses occur.

In one preferred configuration, the first region extends at least in regions over the radiation entrance face. In other words, the first region may at least in regions be arranged opposite the radiation entrance face. The first region may completely or partially overlap the radiation entrance face or the emission face. The first radiation portion preferably impinges directly on the first region and is reflected in this region towards the second region. One advantage of this configuration is that the largest possible portion of radiation entering the optical element through the radiation entrance face impinges on the first region or may be reflected thereby. In this way, the radiant power emitted backwards may be increased, since this stems from the first radiation portion.

In a preferred configuration, the second region is arranged on an outside of the optical element when the optical element is viewed in plan view, next to the first region.

In a preferred configuration, the second region is arranged and embodied to direct or transmit a second radiation portion of radiation entering the optical element through the radiation entrance face and impinging directly on the second region in a direction which points away from the plane defined by the radiation entrance face. The second radiation portion preferably impinges directly on the second region, without previously having been reflected in the first region. One advantage of this configuration is that the second radiation portion or the radiation emitted by the lighting device has a direction component which points in the direction of radiation entrance into the optical element. In other words, at least one direction component of the second radiation portion may point forwards after passing through the boundary surface. Radiation may thereby be emitted advantageously forwards by the optical element, i.e., at an angle of less than 90° relative to the surface normal of the emission face or to the radiation entrance direction.

In other words, radiation entering the optical element through the radiation entrance face may impinge indirectly, i.e., after reflection in the first region, on the second region, in order to be deflected backwards and likewise radiation which impinges directly on the second region may be directed forwards, for example, refracted, or transmitted by the second region. It is in this way advantageously possible overall to achieve emission of the optical element or of the lighting device which is distributed over a large angular range, relative to the surface normal of the emission face.

One advantage of the lighting device with the optical element is that an emission pattern may be achieved by means of the lighting device which is modelled on or similar to that of a conventional incandescent lamp.

In a preferred configuration, the first region is arranged and embodied such that at least a major part of the radiation entering through the radiation entrance face and impinging in particular directly on the first region is totally reflected in the first region. As a result of this configuration, the first radiation portion advantageously does not experience any or only slight losses through reflection in the first region.

In one preferred configuration, the boundary surface of the optical element comprises a third region. The third region may, in particular when viewed in plan view and/or in cross-section through the first and second regions, be arranged on a side of the first region remote from the second region. Furthermore, the third region may be arranged and embodied to direct or transmit a third radiation portion of radiation entering the optical element through the radiation entrance face and impinging directly on the third region in a direction which points away from the plane defined by the radiation entrance face.

One advantage of the described optical element is that, like the second radiation portion, the third radiation portion comprises a direction component which points in the direction of radiation entrance into the optical element. This configuration advantageously allows radiation from the third region of the optical element to be emitted forwards, i.e., at an angle of less than 90° relative to the surface normal of the emission face or to the radiation entrance direction.

The third region preferably extends at least in regions or only in regions over the emission face of the radiation-emitting semiconductor chip.

In a preferred configuration, when viewed in cross-section, the first region is arranged between the second and third regions. The second and third regions are in this case preferably arranged on opposing sides of the first region.

The first and second regions of the boundary surface may be arranged in a first part of the optical element when viewed in plan view onto the optical element. The third region may be arranged in a second, part, when viewed in plan view onto the optical element. The first part may be arranged in a first 180° azimuthal sector of the optical element, wherein the second part may be arranged in a second 180° azimuthal sector of the optical element. The azimuthal angle relates in the present case to the plane defined by the radiation entrance face.

The first and second regions are preferably arranged and embodied in such a way that radiation which, in particular in the first part, impinges on the radiation entrance face at an angle of 0° to 45° relative to the surface normal, in particular impinges for the most part on the first region, and that radiation which, in particular in the first part, impinges on the radiation entrance face at an angle of 45° to 90° relative to the surface normal, in particular impinges for the most part on the second region. The third region is preferably arranged and embodied such that radiation which in the second part impinges on the radiation entrance face at an angle of 0° to 90° relative to the surface normal, impinges for the most part on the third region.

In a preferred configuration, radiation exits from the optical element via the second region of the boundary surface. This applies preferably both to the first and to the second radiation portion. Advantageously, as a result of this configuration, both the first and the second radiation portions are emitted by the optical element and thus contribute to formation of an emission pattern.

Preferably, no or almost no radiation exits via the first region of the boundary surface of the optical element.

In a preferred configuration, the optical element takes the form of microoptics. In microoptics, diffraction effects, such as Fresnel diffraction, are, for example, non-negligible for beam shaping. By using microoptics, the optical element may advantageously be made compact and used for beam shaping for radiation emitted by a single radiation-emitting semiconductor chip. A point light source may possibly no longer be assumed in beam shaping using microoptics as the optical element, since an emission face of the radiation-emitting semiconductor chip can no longer be definitely regarded as small relative to the lateral dimensions of the optical element or the microoptics.

In a preferred configuration, the boundary surface is asymmetric. This asymmetry preferably relates, when viewed in cross-section, to a surface normal of the emission face or to an axis parallel thereto. Asymmetry preferably arises in that the first, second and third regions are differently embodied. The first and second regions are arranged on one side of the surface normal and the third region is arranged on the other side. An emission pattern may in this way advantageously be achieved in which on the one side of the axis of symmetry radiation is emitted forwards and backwards by the lighting device and on the other side only forwards.

In one configuration the boundary surface is symmetrical. As a result of this configuration, a symmetrical emission pattern of the lighting device may advantageously also be achieved. In this configuration, the first and second regions are preferably symmetrical, i.e., when viewed in cross-section in each case arranged on either side of an axis of symmetry, without a third region of the boundary surface being provided. Advantageously, in this way an emission pattern may be achieved in which on both sides of the axis of symmetry radiation is emitted forwards and backwards by the lighting device.

In a preferred configuration, the second region extends at least over a sector of 45° to 90° relative to the surface normal of the emission face.

In a preferred configuration, the first region extends over a sector of 0° to 45° relative to the surface normal of the emission face.

As a result of these configurations, it is possible both for a large radiation portion to impinge on the first region and a large radiation portion to impinge on the second region, in order to be emitted respectively backwards or forwards by the lighting device. Preferably, the second region does not extend over a sector of 0° to 45° relative to the surface normal of the emission face.

In a preferred configuration, the optical element is arranged and embodied such that a maximum difference in the radiant intensity, preferably light intensity, of the radiation exiting from the optical element at an angle of between 0° and 135° relative to the surface normal of the emission face is less than 40%, preferably less than 20%. Preferably, the radiation exiting from the optical element is also the radiation emitted by the lighting device. As a result of this configuration, a radiant intensity distribution or light intensity distribution of the lighting device may advantageously be achieved, which is as uniform as possible over a large angular range. This may be achieved by suitable configuration of the first and second regions.

In a preferred configuration, the optical element is arranged and embodied such that at least 3% of the radiant power, preferably of the luminous flux, of the radiation exiting from the optical element is emitted by the lighting device at an angle of between 135° and 180° relative to the surface normal of the emission face. As a result of this configuration, a relatively large radiation portion may advantageously be emitted by the lighting device at an angle of more than 90° relative to the surface normal of the emission face. This may be achieved by suitable configuration of the first and second regions.

In a preferred configuration, the length of the optical element is greater than five times the length of the radiation-emitting semiconductor chip. These lengths are preferably viewed along the cross-section and measured perpendicular to the surface normal. As a result of this geometry, it is possible, in combination with the above-described configurations, particularly simply to embody a large first region of the boundary surface and thus to achieve significant backwards emission of radiation.

A further aspect of the present application relates to a lighting arrangement comprising a plurality of lighting devices of a first type and a plurality of lighting devices of a second type. The lighting devices of the first type correspond to the lighting devices described hitherto.

In a preferred configuration, the lighting devices of the first and the lighting devices of the second type are arranged in a field, preferably in a flat field. The lighting devices of the first type in this case form a border round the field. In other words, the lighting devices of the first type are arranged at an outer edge of the field and the lighting devices of the second type are arranged inside the field. The field may be one-dimensional, two-dimensional or three-dimensional.

The optical elements of the lighting devices of the first type preferably comprise an asymmetrical cross-section or a boundary surface of asymmetrical cross-section.

The optical elements of the lighting devices of the second type preferably comprise a symmetrical cross-section or a boundary surface of symmetrical cross-section.

This configuration of the lighting arrangement advantageously allows an emission pattern according to the lighting devices of the first type to be achieved at the outer edge of the field and an emission pattern according to the lighting devices of the second type to be achieved inside the field. The emission patterns of the lighting devices of the first and second types are preferably different. The emission patterns of the lighting devices of the first type may in each case be the same or similar. The same is true for the emission patterns of the lighting devices of the second type. The field is preferably two-dimensional in embodiment. The field is preferably furthermore of planar construction. This advantageously allows inexpensive production of the lighting arrangement, since radiation-emitting semiconductor chips likewise associated with the lighting devices of the first and second types may be arranged, fastened and/or contacted in a plane or on a planar carrier.

In a preferred configuration, the lighting devices of the first type are arranged such that the second regions of the boundary faces of the optical elements of the lighting devices of the first type are arranged at the outer edge of the field. Optical elements of the lighting devices of the second type are in each case provided for beam shaping for radiation emitted by a radiation-emitting semiconductor chip. These radiation-emitting semiconductor chips may correspond to those described above. Furthermore, the lighting devices of the second type are arranged and embodied so as to direct or transmit radiation entering the respective optical element of the lighting device of the second type in a direction pointing away from a plane defined by at least one radiation entrance face of the optical elements of the lighting devices of the second type.

As a result of this configuration, radiation may advantageously be emitted by the lighting arrangement in such a way that a maximally uniform distribution of the radiant intensity or light intensity over a large angular or solid angle range is achieved.

A further aspect of the present invention relates to a lighting device, wherein the optical element is provided for beam shaping for radiation emitted by a plurality of radiation-emitting semiconductor chips. Through this configuration, the mounting or adjustment effort required for the optical element relative to the other components of the lighting device may advantageously be kept low.

BRIEF DESCRIPTION OF THE DRAWINGS

Further advantages, advantageous configurations and convenient aspects are revealed by the following description of the exemplary embodiments in conjunction with the figures.

FIGS. 1C to 1E show schematic sectional views (top) and schematic plan views (bottom) of different exemplary embodiments of a lighting device.

Identical and similar elements and those which act in the same way are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1A:
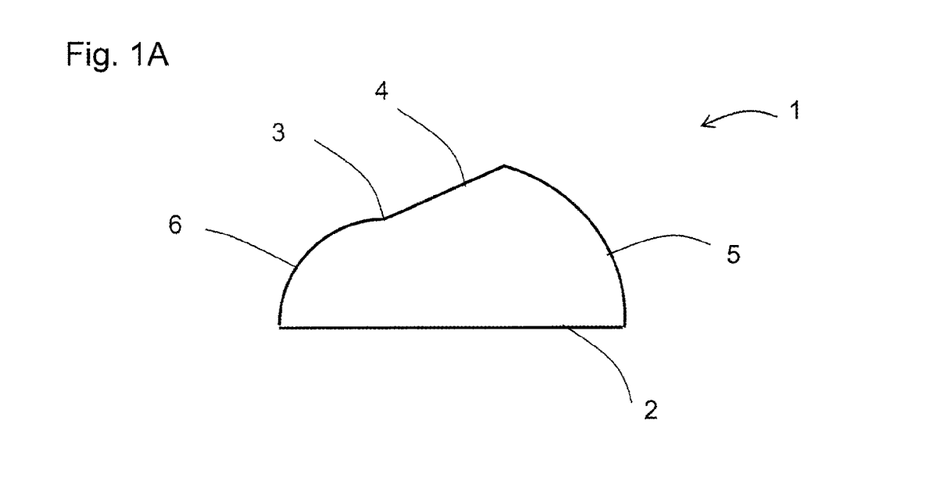
FIG. 1A shows a schematic sectional view of an exemplary embodiment of an optical element.

FIG. 1A shows a schematic sectional view of an optical element 1. The optical element 1 has a radiation entrance face 2 and a boundary surface 3. The boundary surface 3 in turn has a first region 4 and a second region 5. Furthermore the boundary surface 3 has a third region 6. The second region 5, when viewed in cross-section, is arranged between the second region 5 and the third region 6. On one side, the first region 4 merges into the second region 5. On another side the first region 4 merges into the third region 6. The second region 5 extends with increasing distance from the first region 4 in the direction of the radiation entrance face 2 or a plane defined thereby.

Figure 1B:
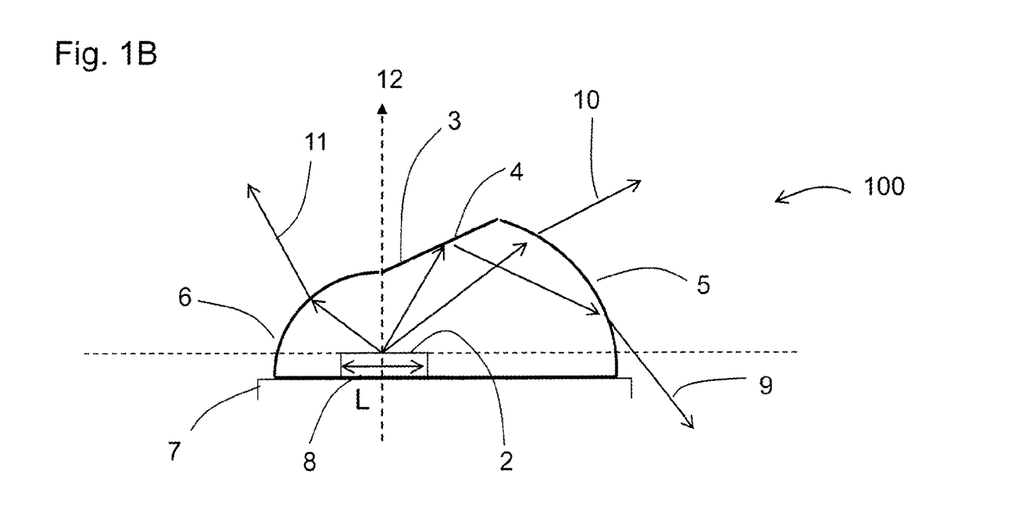
FIG. 1B shows a schematic sectional view of a lighting device according to a first exemplary embodiment with an optical element similar to FIG. 1A.

FIG. 1B shows a schematic sectional view of a lighting device 100 according to a first exemplary embodiment, comprising an optical element 1 which, unlike the optical element shown in FIG. 1A, additionally comprises a recess (not explicitly labelled). The lighting device 100 further comprises a carrier 7 and a radiation-emitting semiconductor chip 8, preferably an LED chip, which is arranged or fastened on the carrier 7. The term "radiation" relates in the present application preferably to electromagnetic radiation, for example, visible light, preferably white light.

In FIG. 1B the radiation-emitting semiconductor chip 8 is arranged in the recess in the optical element 1. An upper edge of the recess forms the radiation entrance face 2, which moreover is of planar configuration and is arranged parallel to an emission face of the radiation-emitting semiconductor chip 8. In particular, the radiation entrance face 2 and the emission face of the radiation-emitting semiconductor chip 8 are directly in flat contact with one another. The first region 4 here extends at least in regions over the radiation entrance face 2, for example, more than 40% or up to 50% or more.

In the sectional view in FIG. 1B, the first region 4 and second region 5 are arranged on the right and the third region 6 on the left of a surface normal 12, for example, the mid-perpendicular of the emission face of the radiation-emitting semiconductor chip 8.

The length L of the optical element 1 is preferably greater than five times the length of the radiation-emitting semiconductor chip 8.

In the schematic view of FIG. 1B the first region 4 extends straight by way of example, without this being necessary for the present design. The second region 5 and the third region 6 are in contrast shown curved. The second region 5 extends to the right of the surface normal 12 of the radiation entrance face 2 preferably over a sector of 45° to 90° relative thereto. The first region 4 extends to the right of the surface normal 12 preferably over a sector of 0° to 45° relative thereto. The third region 6 extends to the left of the surface normal 12 preferably over a sector of 0° to 90° relative thereto. In addition to the surface normal 12, the emission face 2 is in each case crucial for sizing of the stated angle. The boundary surface 3 from FIG. 1B is additionally asymmetrical in shape relative to the surface normal 12.

As examples of radiation emitted by the radiation-emitting semiconductor chip 8 and entering the optical element 1, radiation portions 9, 10 and 11 are shown in FIG. 1B by the arrows.

The first radiation portion 9 impinges on the first region 4 and is reflected thereby, preferably totally reflected. Total reflection arises when the angle at which a ray or radiation impinges on a point of the boundary surface 3 of the first region 4 is greater, relative to a tangent normal through this point, than the critical angle of the total reflection of the optical element 1 in the medium surrounding the latter at said point. The tangent normal at the stated point is likewise in each case crucial for sizing of this critical angle.

The first radiation portion 9 is reflected by the first region 4 towards the second region 5, on which it impinges, preferably directly. After the reflection in the first region 4, the first radiation portion 9 is deflected in the second region 5 with at least one direction component towards a plane defined by the radiation entrance face 2 (towards bottom right in FIG. 1B) and exits from the optical element 1. The plane defined by the radiation entrance face 2 is indicated in FIG. 1B by the dashed horizontal line. The second radiation portion 10 impinges directly, i.e., without previous reflection in the first region 4, on the second region 5 and is directed or transmitted thereby with at least one direction component in a direction which points away from the plane defined by the radiation entrance face 2 (towards top right in FIG. 1B). The third radiation portion 11 impinges, on a side of the surface normal 12 remote from the first and the second regions 4 and 5, in particular likewise directly on the third region 6 and is directed or transmitted thereby with at least one direction component in a direction which points away from the plane defined by the radiation entrance face 2 (towards top left in FIG. 1B). The radiation portions 10 and 11 likewise exit from the optical element 1.

Thus, the first radiation portion 9 is emitted in an angular range greater than 90° relative to the surface normal 12 (backwards) by the lighting device 100 and the second and third radiation portions 10, 11 are emitted in an angular range of less than 90° relative to the surface normal 12 (forwards) by the lighting device 100.

The optical element 1 may moreover be connected to the radiation-emitting semiconductor chip 8 by suitable means. The optical element 1 may be fastened to the carrier 7 or the radiation-emitting semiconductor chip 8 or another component using an interference fit, hot interference fit, an adhesive bond or a thermal riveted joint. To produce the optical element 1, it is possible, for example, to use a molding or compression method, for instance an injection molding, injection compression molding or compression molding method or a transfer molding method.

Preferably, the optical element 1 includes a plastics material, for instance PMMA (polymethyl methacrylate), an epoxide or a silicate. The optical element may take the form of an add-on or offset lens. In an embodiment of the optical element as an add-on or offset lens, the optical element is preferably made of glass. The optical element may moreover be placed or molded onto the radiation-emitting semiconductor chip 8. The optical element is in this case preferably free of undercuts. In this case, it is possible to avoid costly use of a split in the mould when producing the optical element.

The optical element preferably takes the form of a lens or is lenticular, in particular takes the form of a lens or microlens embodied for radiation shaping.

The optical element 1 preferably takes the form of microoptics and is provided for beam shaping for radiation emitted by a single radiation-emitting semiconductor chip 8. Alternatively, the optical element 1 may also be provided, arranged and embodied for beam shaping for radiation emitted by a plurality of radiation-emitting semiconductor chips.

Contacting of the radiation-emitting semiconductor chip may preferably proceed by so-called "flip-chip" design or by means of so-called "chip-bonding" using connecting wires. In this respect, the carrier 7 may comprise connecting wires with whose contacts the radiation-emitting semiconductor chips are connected. The radiation-emitting semiconductor chip may be connected to the carrier 7 by so-called "chip-on-board" technology. This configuration has the advantage of a low component height for the stated components or the lighting device. The carrier 7 of the radiation-emitting semiconductor chip 8 may preferably be optimized in terms of heat dissipation from the radiation-emitting semiconductor chip 8.

The optical element 1 is moreover arranged and embodied such that a maximum difference in the light intensity of the radiation emitted by the lighting device 100 or the optical element 1 at an angle of between 0° and 135° relative to the surface normal 12 is less than 40%, preferably less than 20%. Furthermore, the optical element 1 is arranged and embodied such that at least 3% of the luminous flux, of the radiation exiting from the optical element, is emitted by the lighting device at an angle of between 135° and 180° relative to the surface normal 12.

Preferably, the lateral distance (measured horizontally) of the carrier 7 from an edge of the optical element 1 is selected to be as small as possible, so that as large as possible a radiation portion may be emitted backwards by the lighting device 100, without a significant radiation portion being absorbed or reflected by the carrier 7.

Alternatively or in addition, a carrier material transparent for the radiation emitted by the lighting device 100 may be provided, such that the radiation portion emitted by the lighting device 100 is particularly large, since then radiation may also be emitted through the carrier 7. The above-stated distance-optimized solution has the advantage, however, of a more simply achievable greater thermal conductivity relative to a transparent carrier material, which usually has a lower thermal conductivity. The optical element may moreover comprise a single material or two layered materials with different refractive indices. The refractive indices of these materials may be matched to one another. The inner material or material arranged at the bottom may in this case comprise a high-refractive-index silicone, and the outer material or material arranged at the top, from which the radiation exits from the optical element, may in this case comprise low-refractive-index silicone. The inner boundary surface may then preferably form the boundary surface crucial for beam shaping having the first, second and optionally third regions. The outer material may, for example, be over-laminated. This embodiment has the advantage that contamination of the boundary surface of the inner material may be prevented or restricted.

Figure 1C:
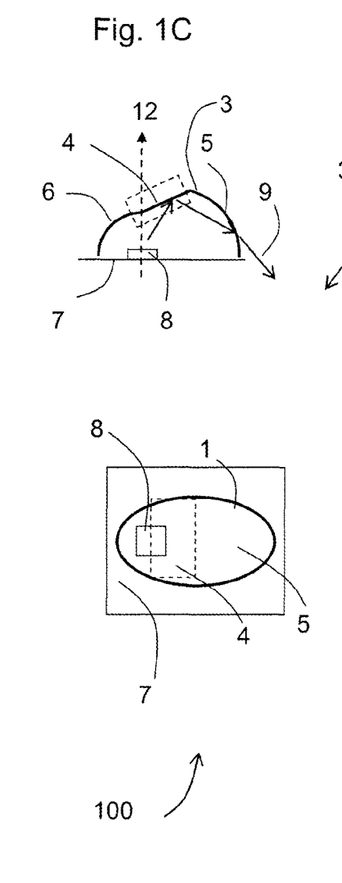
FIG. 1C shows a lighting device according to FIG. 1A.

FIG. 1C shows at the top a schematic sectional view of the lighting device 100 according to that of FIG. 1B. The dashed rectangle indicates the first region 4, in which reflection, preferably total reflection of radiation takes place. Via the second region 5, radiation which was reflected in the first region 4, as described above, is emitted backwards by the lighting device 100 (see, e.g., first radiation portion 9). Via the second region 5 and the third region 6, radiation is emitted forwards by the lighting device 100. The bottom view is a schematic plan view of the lighting device 100, in which the carrier 7, the radiation-emitting semiconductor chip 8 and the optical element 1 are shown. Once again, the dashed rectangle indicates the first region 4, in which reflection of radiation takes place.

Figures 1D, 1E:
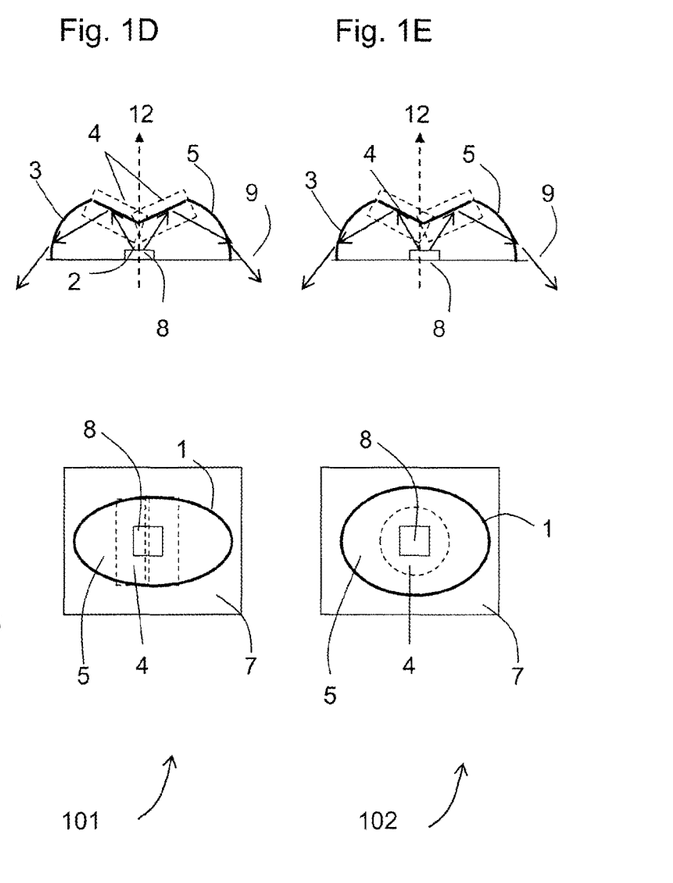
FIGS. 1D and 1E each show further exemplary embodiments of lighting devices.

FIGS. 1D and 1E describe, in a manner similar to FIG. 1C, lighting devices 101 and 102 with in each case a carrier 7, a radiation-emitting semiconductor chip 8 and an optical element 1.

FIG. 1D shows at the top a schematic sectional view of a lighting device 101, which, in contrast to FIG. 1C, has a boundary surface 3 of the optical element 1 symmetrical relative to the surface normal 12. Furthermore, the boundary surface 3 comprises two first regions 4 and two second regions 5. The boundary surface 3 in particular has no third region. The first regions 5 merge together in the region of the surface normal 12. The first regions 4 each merge on the outside into a separate second region 5. Each first region extends at least in regions over the radiation entrance face 2. Radiation emitted by the radiation-emitting semiconductor chip 8 may accordingly be reflected by the first regions 4 and, after reflection in the first regions 4, be deflected backwards by the second regions 5 and emitted by the lighting device 101 (see, e.g., first radiation portions 9). This takes place on both sides of the surface normal 12. The plan view of the lighting device 101 shown below likewise reveals that the first regions 4 are arranged between the second regions 5. As described above with reference to FIG. 1C, the dashed rectangles indicate the first regions 4, in which reflection of radiation takes place. The second regions 5 are separated by the first regions 4.

The top view in FIG. 1E is a schematic sectional view of the lighting device 102, which likewise has a boundary surface 3 of the optical element 1 symmetrical relative to the surface normal 12. The sectional view corresponds to that of FIG. 1D. The plan view of FIG. 1E shown below reveals, however, that the optical element 1 has a first region 4 rotationally symmetrical relative to the surface normal 12, which region 4 overlaps the radiation-emitting semiconductor chip 8 (see, e.g., dashed circle). Furthermore, the second region 5 surrounds the first region 4 in the circumferential direction. The second region 5 may likewise be arranged in rotationally symmetrical manner. Radiation emitted by the radiation-emitting semiconductor chip 8, which impinges on the first region 4, is reflected in a manner similar to the above embodiments, and after reflection in the first region 4 is deflected backwards in the second region 5. This configuration may lead to rotationally symmetrical emission by the lighting device 102.

Although not represented explicitly here, provision is likewise made in the case of lighting devices 101 and 102, as described further above, for second radiation portions to be directed directly forwards by the second regions 5.

Likewise, the optical element may be configured in such a way that the first, second and optionally third regions of the boundary surface of the optical element are distributed circumferentially or azimuthally in any desired way around the optical element, in order to shape an emission pattern of the lighting device, when viewed in plan view, purposefully in specific angular ranges.

Figure 2A:
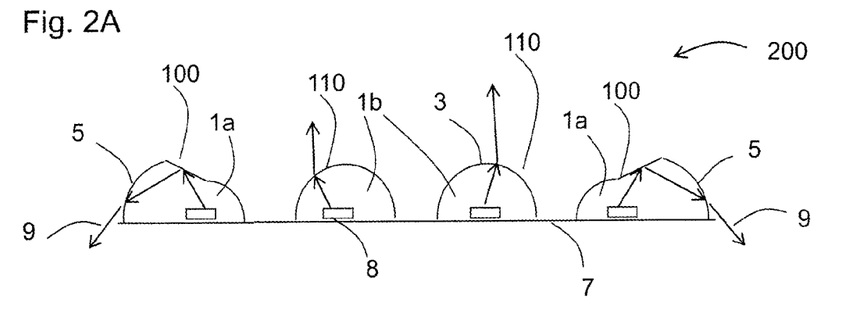
FIG. 2A shows a schematic sectional view of a further exemplary embodiment of a lighting device.

FIG. 2A shows a schematic sectional view of a lighting arrangement 200. The lighting arrangement 200 comprises a plurality of lighting devices 100 of a first type and a plurality of lighting devices 110 of a second type, which are arranged on a common carrier 7. The lighting devices 100 of the first type are preferably formed by the above-described lighting devices 100 and each have optical elements 1a and radiation-emitting semiconductor chips 8.

The lighting devices of the first and second types are arranged preferably in a flat, preferably planar field. The lighting devices 100 of the first type are preferably arranged at an outer edge of the field, particularly preferably around it. The lighting devices 110 of the second type are preferably arranged inside the field. The corresponding first radiation portions 9 are indicated in each case by way of example by the arrows.

The lighting devices 110 of the second type preferably each have a radiation-emitting semiconductor chip 8 as described above and optical elements 1b. The optical elements 1b are preferably moreover in each case arranged and embodied in such a way as to direct forwards (upwards in FIG. 2A) radiation entering the optical elements 1b through radiation entrance faces and impinging directly on a boundary surface 3 of the optical elements 1b. The radiation is then preferably directed forwards at the boundary surfaces 3 and exits from the optical element 1b. The radiation-emitting semiconductor chips 8 may be arranged in a manner similar to FIG. 1B in each case in a recess of the optical elements 1b. The radiation-emitting semiconductor chips 8 are furthermore preferably arranged in a plane.

The optical elements 1a of the lighting devices 100 of the first type are moreover preferably arranged in such a way that the respective second regions 6 are each arranged at the outer edge. Third regions 6 of the lighting devices 100 of the first type may here be directed inwards and in particular accordingly face the lighting devices 110 of the second type.

Figure 2B:
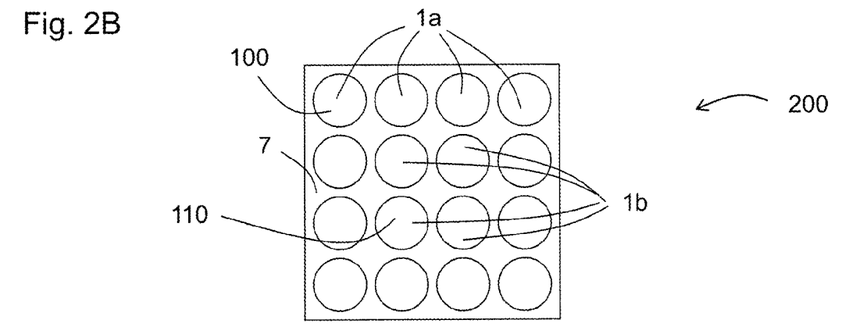
FIG. 2B shows a schematic plan view of a lighting arrangement according to FIG. 2A.

FIG. 2B shows a schematic plan view onto the lighting arrangement 200, which is shown in cross-section in FIG. 2A. A flat, preferably planar field is shown schematically, in which the optical elements 1a and 1b of the lighting devices 100 of the first type and the lighting devices 110 of the second type are arranged. The radiation-emitting semiconductor chips 8 are not shown in this figure, solely to improve clarity.

By way of example, in each case twelve lighting devices 100 of the first type are shown here forming a border round the field, and four lighting devices 110 of the second type inside the field.

Alternatively, instead of a plurality the lighting arrangement 200 may also comprise just one lighting device 110 of a second type with an optical element 1b, which is provided for beam shaping for radiation emitted by one or a plurality of radiation-emitting semiconductor chips 8. This lighting device 110 of the second type may here comprise one or a plurality of radiation-emitting semiconductor chips 8 and be arranged and embodied such that the above-described or similar effects or emission patterns are established.

With the lighting arrangement 200, it is advantageously possible to achieve an emission pattern of radiation with a maximally uniform light intensity distribution over a large angular range, in particular a solid angle range. In addition, the advantage is achieved of simple and/or inexpensive production of the radiation-emitting semiconductor chips 8, which may be manufactured in a plane. In this case, a carrier material and/or connection of the carrier material with the radiation-emitting semiconductor chip 8 including electrical contacting may be configured so as to be able to achieve an optimized thermal connection of the radiation-emitting semiconductor chips 8 on the carrier 7 with improved heat dissipation or simple and effective cooling.

Figure 2C:
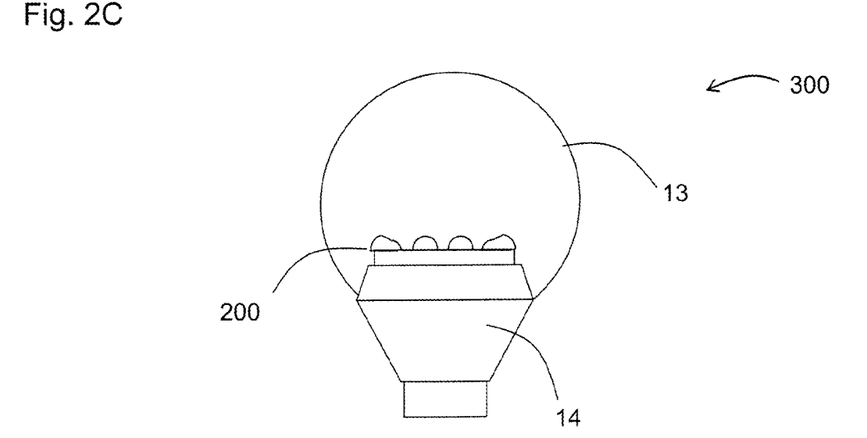
FIG. 2C shows a schematic sectional view of a component with a lighting arrangement according to FIG. 2A.

FIG. 2C shows in a schematic sectional view a component 300 with the lighting arrangement 200 shown in FIGS. 2A and 2B. The component 300 further comprises a bulb- or candle-lamp-shaped cover 13, which is preferably transmissive, e.g. transparent for radiation emitted by the lighting arrangement 200. The lighting arrangement 200 is arranged or mounted inside the cover 13. Furthermore, the component 300 comprises a lampholder 14. This embodiment corresponds to a "retrofit", in which modern light sources, such as, for example, radiation-emitting semiconductor chips, are incorporated into a housing which resembles a conventional incandescent lamp, in particular a bulb or candle lamp. The lampholder 14 may likewise be modelled on an incandescent lamp. This is appropriate in particular in the present invention, since a maximally uniform emission or distribution of the radiant intensity or light intensity may be achieved over a large angular or solid angle range, as known with incandescent lamps. In this case, the approximately isotropic lighting as obtained with an incandescent lamp may be achieved without the component 300 exhibiting the disadvantages of an incandescent lamp, for example, with regard to unsatisfactory energy efficiency.

The component 300 may moreover be configured to generate polychromatic, in particular white light. To this end, part of the radiation generated by the radiation-emitting semiconductor chip 8 (not shown in FIG. 2 for simplicity's sake) excites a luminescence conversion material, for instance a luminescent material, arranged inside the cover 13 to emit long-wave radiation. The luminescence conversion material may in this case comprise $TiO_2$, for example, and be applied as a coating on an inner surface of the cover 13 or a component additionally arranged in the cover (not shown explicitly). The luminescence conversion material is in this case preferably not in thermal contact with the radiation-emitting semiconductor chips. This has the advantage that heat arising during luminescence conversion is not or not significantly transmitted to the radiation-emitting semiconductor chips. The mixture of radiation generated by the radiation-emitting semiconductor chips and radiation re-emitted by the luminescence conversion material may consequently result in polychromatic, in particular white, light. Primary radiation in the blue spectral range generated by the respective radiation-emitting semiconductor chip and radiation in the yellow spectral range re-emitted by the luminescence conversion material are particularly suitable for generating white light. A blue luminous flux emitted, for example, by the lighting arrangement 200 impinges in the component 300 preferably uniformly on the luminescence conversion material and appears to the observer as pleasant white light.

For the purposes of the present application, provision is made for the radiation-emitting semiconductor chips in each case to emit radiation of different spectral ranges, in particular visible spectral ranges. The resultant mixed color may then likewise be additionally converted by the luminescence conversion material.

Figure 3:
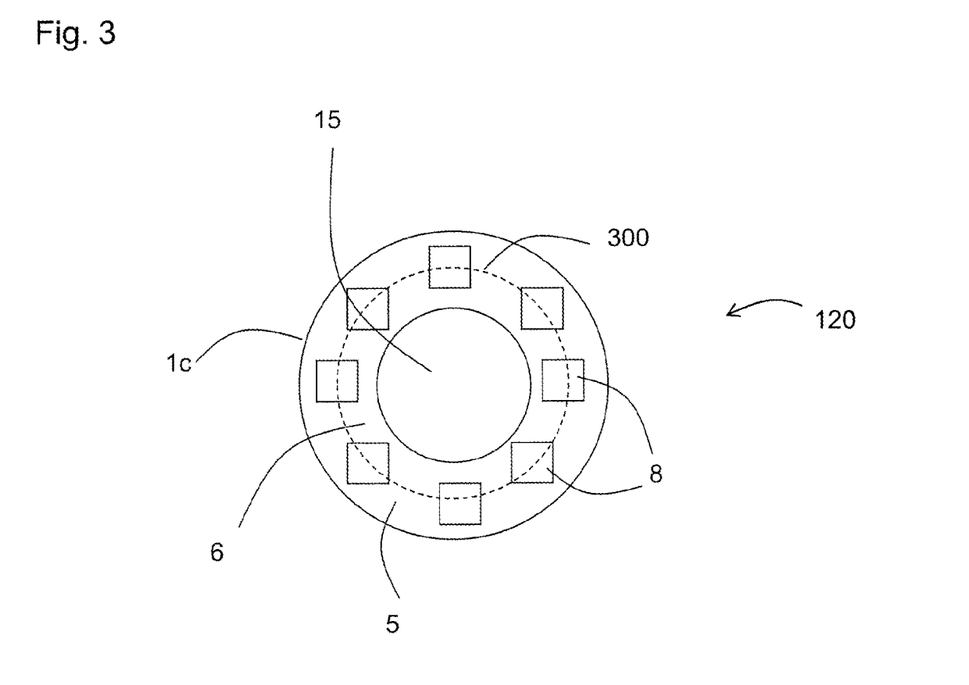
FIG. 3 shows a schematic plan view of a further exemplary embodiment of a lighting device.

FIG. 3 shows in a schematic plan view a further exemplary embodiment of a lighting device. A lighting device 120 is shown which comprises a plurality of radiation-emitting semiconductor chips 8 and an optical element 1c. The optical element 1c is preferably provided, arranged and embodied for beam shaping for radiation emitted by the radiation-emitting semiconductor chips 8. The optical element 1c further comprises an orifice 15 and is of annular configuration.

In a cross-section the lighting device 120 may appear as described above and, for example, illustrated in FIG. 1B. The dashed circle indicates the separation between a first region 4 (not labeled) and a third region 6 of a boundary surface of the optical element 1, such that the surface normal 12 of FIG. 1B would lie on the dashed line in the plan view in FIG. 3. In FIG. 3 the second region 5 is arranged on an outside and the third region 6 on an inside of the optical element 1c. The first, second, and third regions 4, 5 and 6 are here furthermore preferably distributed rotationally symmetrically about the optical element 1c. The lighting device

120 may moreover comprise a carrier (not labelled). Conveniently, the carrier is conformed to the shape of the optical element 1c and/or embodied to be transparent for the corresponding radiation.

For the purposes of the present application, the first region 4 (not labeled) may be arranged both on the outside and on the inside of the optical element 1, depending on in which region it is desired to achieve emission of radiation in a forward or backward direction. As described above, emission proceeds forwards, or with at least one direction component forwards (in FIG. 3 out of the plane of the drawing), in that radiation impinges directly on the second and third regions 5 and 6 and then is optionally transmitted thereby with deflection (see, e.g., second and third radiation portions 10, 11 in FIG. 1B). Backwards emission, or emission with at least one backward direction component (in FIG. 3 into the plane of the drawing) proceeds accordingly in that radiation impinges indirectly on the first region (not labelled in FIG. 3), is reflected and is then deflected by the second region 5 (see, e.g., first radiation portion 9 in FIG. 1B).

Provision is moreover made for the carrier to have an orifice and preferably be of annular configuration. In this case an orifice in the optical element may be dispensed with. The optical element is here preferably likewise arranged on the carrier. According to the desired emission pattern, this optical element may be provided in any desired manner with first, second and third regions and in particular comprise a symmetrical or asymmetrical boundary surface.

Provision is furthermore made for a boundary surface of the optical element 1c to be both symmetrical and asymmetrical when viewed in cross-section, for example, in accordance with FIG. 1C or 1D.

Figure 4A:
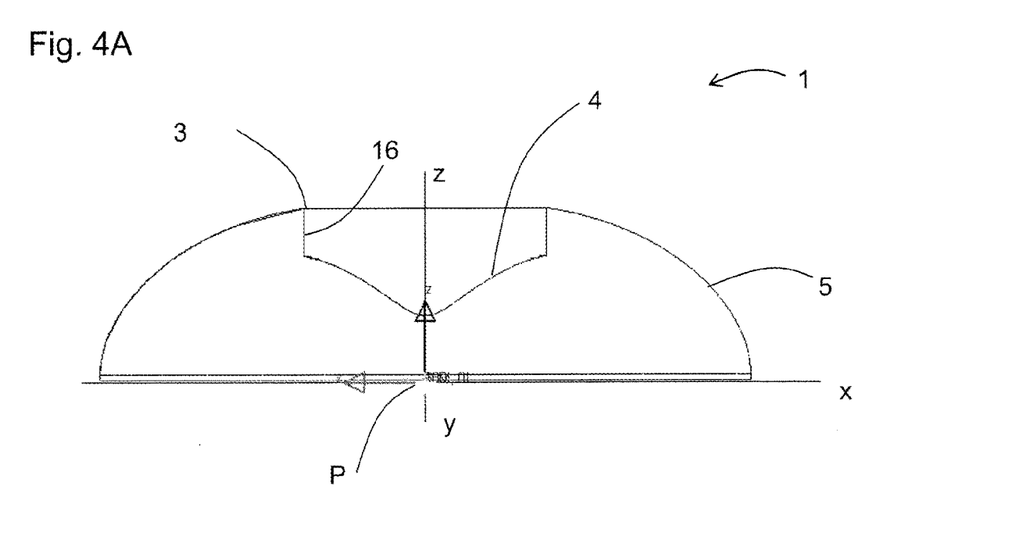
FIGS. 4A, 4B, 5A, 5B, 6A and 6B each show sectional views of further exemplary embodiments of optical elements (in each case Figure A) with associated emission patterns (in each case Figure B).

FIG. 4A shows a sectional view of an optical element 1 with a boundary surface 3 comprising a first region 4 and a second region 5. The first and second regions 4 and 5 should be regarded as distributed rotationally symmetrically about a central z axis. The positive z axis here corresponds relative to the optical element 1 to the direction of the above-described surface normal 12. An x axis extends to the right from a point P and a y axis extends into the plane of the drawing at the point P. It should be noted that the first region 4 is not straight, but rather is curved with a varying direction of curvature. The first region 4 moreover merges via a step 16 into the second region 5.

Figure 4B:
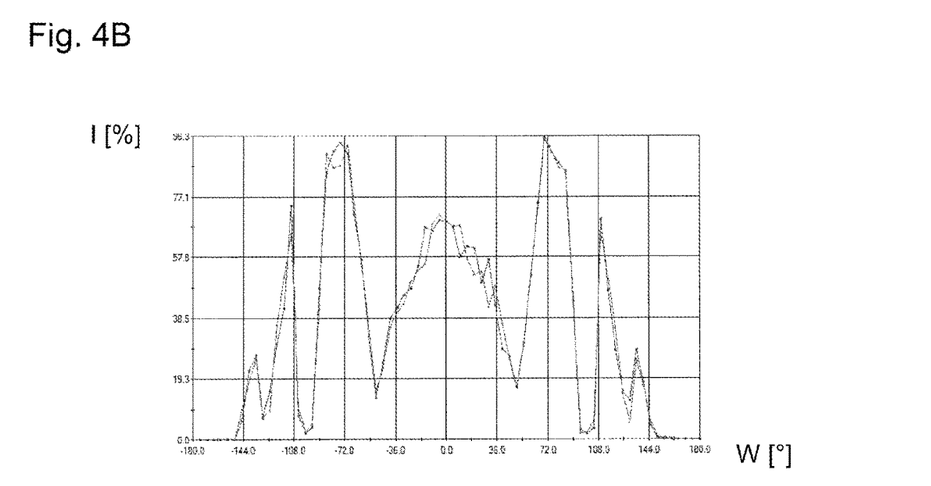

FIG. 4B shows an emission pattern associated with the optical element 1 of FIG. 4A, in which the normalized radiant intensity I is plotted over an angle W relative to the positive z axis. The emission pattern is based on "ray-tracing" simulation with a predetermined radiation source.

Furthermore, the emission pattern comprises two curves, wherein the angle of the one curve relates to the xz plane and that of the other curve to the yz plane. Due to the rotational symmetry of the optical element 1, the two curves largely overlap. Radiation would be emitted completely backwards by the optical element 1 in the case of an angle of −180° or 180°. However, it should be noted that radiation is in each case, i.e., in the positive and negative angular ranges, emitted only up to an angle of something over 150° relative to the positive z axis. For larger angles the intensity is equal to zero. Overall, the emission pattern in each case comprises intensity maxima at approx. 110° and 72° and a central maximum at an angle of approx. 0°.

Figure 5A:
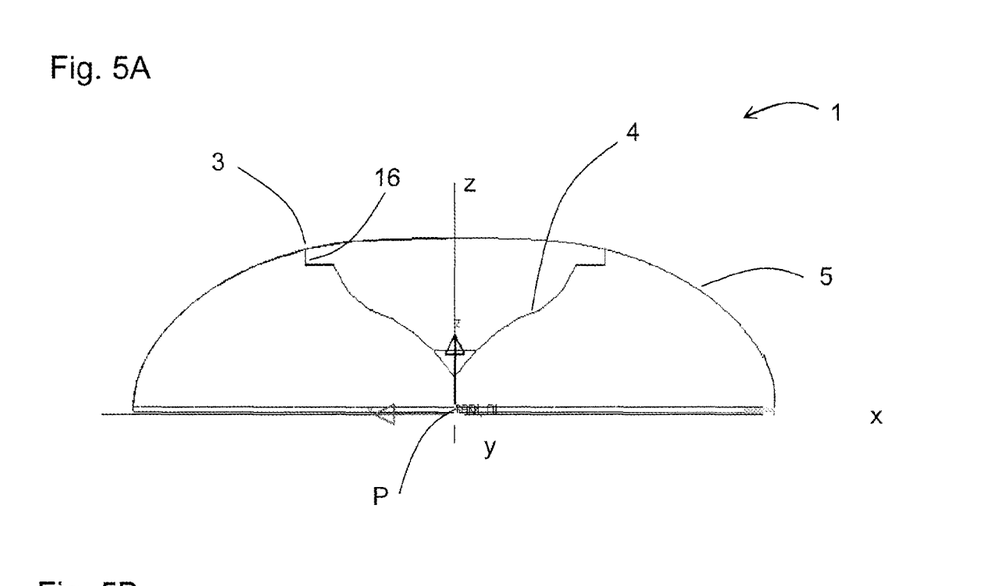
Figure 5B:
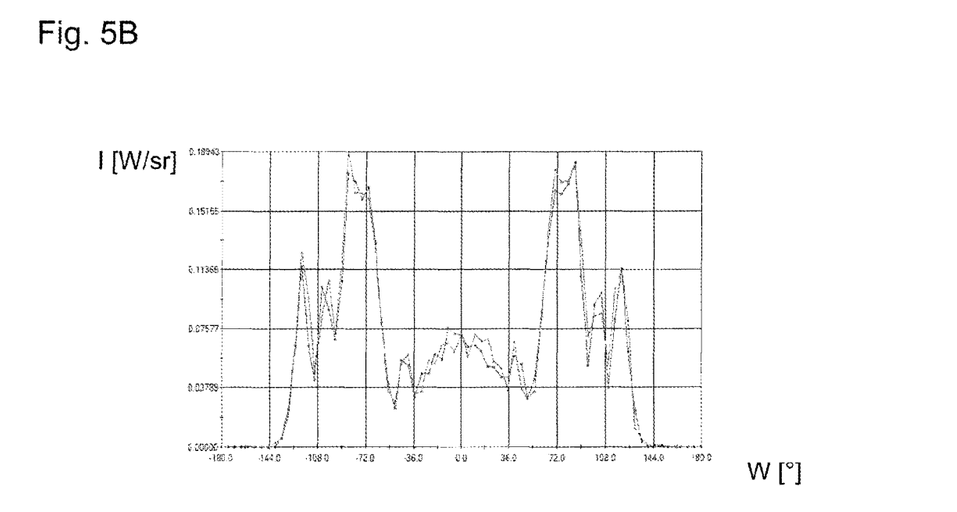

Like FIG. 4, FIG. 5 shows a sectional view of a further exemplary embodiment of an optical element 1 (FIG. 5A) with the associated emission pattern (FIG. 5B). Unlike in FIG. 4A, the intensity I is indicated in watts per steradian and the first region 4 of FIG. 5A is wider when viewed laterally. The first region 4 is here likewise slightly differently configured in comparison with the first region of FIG. 4A. Consequently, a different emission pattern also arises in FIG. 5B due to the modified geometry. In comparison with FIG. 4B, a central intensity maximum is likewise smaller relative to intensity maxima at larger angles. In FIG. 5B radiation is moreover emitted in each case only up to an angle of approx. 144° relative to the positive z axis.

Figure 6A:
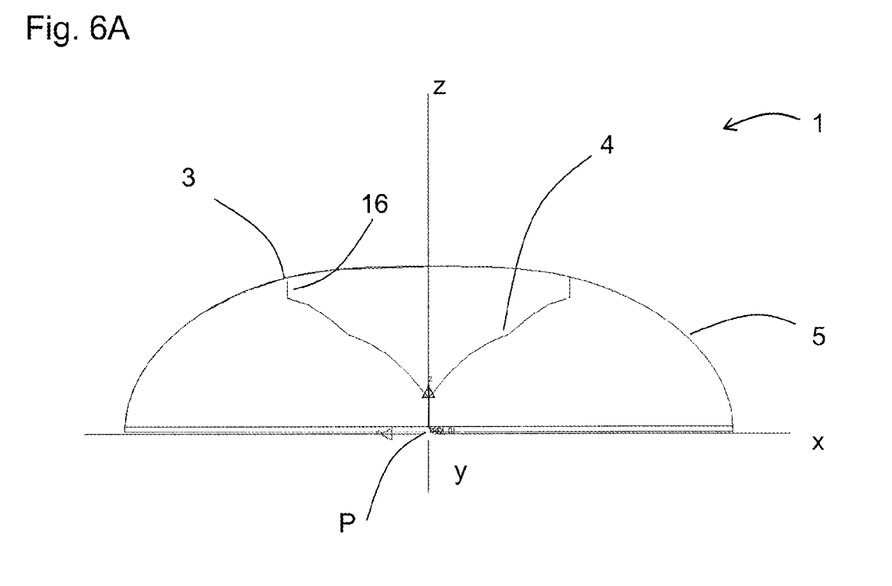
Figure 6B:
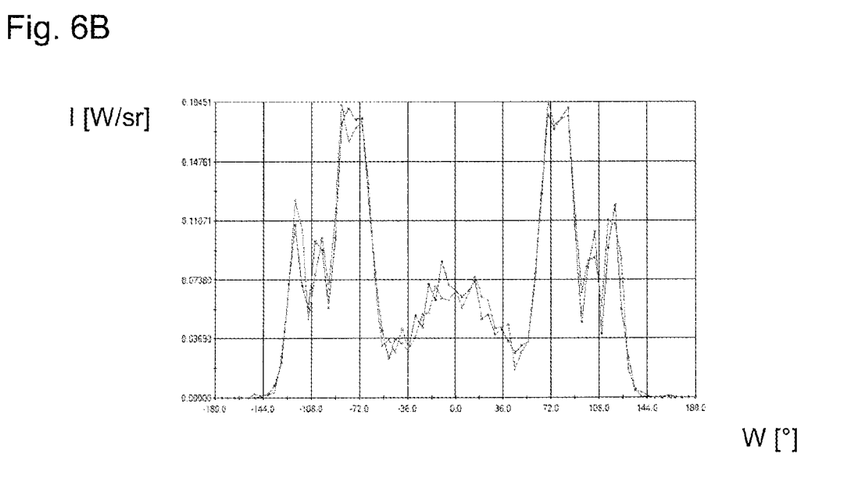

Like FIG. 5, FIG. 6 shows a sectional view of a further exemplary embodiment of an optical element 1 (FIG. 6A) with the associated emission pattern (FIG. 6B). The embodiment of the first region 4 is here likewise different from that in FIGS. 4B and 5B. A conspicuous feature of FIG. 6A is the slightly undulating shape of the first region 4. In FIG. 6B, the modified geometry and thus modified reflection in the first region 4 likewise gives rise to a slightly modified emission pattern compared with FIG. 5B. In this case radiation is in each case emitted up to an angle of something over 150° relative to the positive z axis.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optical element for beam shaping for radiation emitted by a radiation-emitting semiconductor chip, the optical element comprising:
   a radiation entrance face; and
   a boundary surface different from the radiation entrance face, the boundary surface having two first regions and two second regions arranged and embodied such that a first radiation portion of radiation entering the optical element through the radiation entrance face is reflected in the first regions and after reflection in the first regions is deflected in the second regions towards a plane defined by the radiation entrance face,
   wherein the boundary surface is symmetrical relative to a surface normal of an emission face of the radiation-emitting semiconductor chip, wherein the first regions merge together in the region of the surface normal, and the first regions each merge on the outside into a separate second region, and wherein the second regions are arranged and embodied to direct a second radiation portion of radiation entering the optical element through the radiation entrance face and impinging directly on the second region in a direction that points away from the plane defined by the radiation entrance face.

2. The optical element according to claim 1, wherein the first region extends over at least regions of the radiation entrance face.

3. The optical element according to claim 1, wherein the first regions are arranged and embodied such that a portion of the radiation entering through the radiation entrance face and impinging on the first region is regions are totally reflected in the first regions.

4. The optical element according to claim 1, wherein radiation exits the optical element via the second regions of the boundary surface.

5. A lighting device having an optical element according to claim 1, wherein the lighting device comprises a radiation-emitting semiconductor chip with the emission face, and wherein the emission face determines the surface normal.

6. The lighting device according to claim 5, wherein the optical element comprises a recess, in which the radiation-emitting semiconductor chip is arranged.

7. The lighting device according to claim 5, wherein the semiconductor chip is a surface emitter.

8. The lighting device according to claim 5, wherein each second region extends at least over a sector of 45° to 90° relative to the surface normal.

9. The lighting device according to claim 5, wherein the optical element is arranged and embodied such that a maximum difference in light intensity of the radiation exiting from the optical element at an angle of between 0° and 135° relative to the surface normal is less than 40%, preferably less than 20%.

10. The lighting device according to claim 5, wherein the optical element is arranged and embodied such that at least 3% of luminous flux of the radiation exiting from the optical element is emitted by the lighting device at an angle of between 135° and 180° relative to the surface normal.

11. The lighting device according to claim 5, wherein a length of the optical element is greater than five times a length of the radiation-emitting semiconductor chip.

12. The lighting device according to claim 5, wherein the optical element is provided for beam shaping for radiation emitted by a plurality of radiation-emitting semiconductor chips.

13. A lighting arrangement having a plurality of lighting devices, each lighting device comprising a radiation-emitting semiconductor chip and an optical element for beam shaping for radiation emitted by the radiation-emitting semiconductor chip,
    wherein the lighting devices form a plurality of lighting devices of a first type, and a plurality of lighting devices of a second type,
    wherein the lighting devices of the first type and the lighting devices of the second type are arranged in a flat field,
    wherein the lighting devices of the first type form a border of the field,
    wherein the optical elements of the lighting devices of the first type have an asymmetrical cross-section, each optical element of a lighting device of the first type comprising:
        a radiation entrance face; and
        a boundary surface different from the radiation entrance face, the boundary surface having a first region and a second region arranged and embodied such that a first radiation portion of radiation entering the optical element through the radiation entrance face is reflected in the first region and after reflection in the first region is deflected in the second region towards a plane defined by the radiation entrance face, and
    wherein the optical elements of the lighting devices of the second type have a symmetrical cross-section.

14. The lighting arrangement according to claim 13, wherein the lighting devices of the first type are arranged such that the second regions of the boundary surfaces of the optical elements of the lighting devices of the first type are arranged at an outer edge of the field, and optical elements of the lighting devices of the second type, which are each provided for beam shaping for radiation emitted by a radiation-emitting semiconductor chip, are arranged and embodied for directing radiation entering the respective optical element of the lighting device of the second type in a direction which points away from a plane defined by at least one radiation entrance face of the optical elements of the lighting devices of the second type.

15. The lighting arrangement according to claim 13, wherein the asymmetry and the symmetry relate to, when viewed in cross-section, a surface normal of an emission face or to an axis parallel thereto.

16. The lighting arrangement according to claim 13, wherein emission patterns of the lighting devices of the first type and of the lighting devices of the second type are different.

17. An optical element for beam shaping for radiation emitted by a radiation-emitting semiconductor chip,
    wherein the optical element comprises a radiation entrance face and a boundary surface different from the radiation entrance face with a first region and a second region,
    wherein the first and second regions are arranged and embodied such that a first radiation portion of radiation entering the optical element through the radiation entrance face is reflected in the first region and after reflection in the first region is deflected in the second region towards a plane defined by the radiation entrance face,
    wherein the boundary surface is asymmetrical; and,
    wherein the asymmetry relates to, when viewed in cross-section, a surface normal of an emission face of the radiation-emitting semiconductor chip or to an axis parallel to the surface normal, and
    wherein the second region is arranged and embodied to direct a second radiation portion of radiation entering the optical element through the radiation entrance face and impinging directly on the second region in a direction that points away from the plane defined by the radiation entrance face.

* * * * *

UNITED STATES PATENT AND TRADEMARK OFFICE
CERTIFICATE OF CORRECTION

PATENT NO. : 10,047,915 B2  
APPLICATION NO. : 14/430979  
DATED : August 14, 2018  
INVENTOR(S) : Ales Markytan Page 1 of 1

It is certified that error appears in the above-identified patent and that said Letters Patent is hereby corrected as shown below:

In Column 14, Line 58, Claim 3, delete "region is".

Signed and Sealed this  
Second Day of October, 2018

Andrei Iancu  
*Director of the United States Patent and Trademark Office*